(12) United States Patent
Lim et al.

(10) Patent No.: US 8,502,286 B2
(45) Date of Patent: Aug. 6, 2013

(54) ETCH STOP LAYERS AND METHODS OF FORMING THE SAME

(75) Inventors: Ha-Jin Lim, Seoul (KR); Dong-Suk Shin, Yongin-si (KR); Pan-Kwi Park, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 394 days.

(21) Appl. No.: 12/841,245

(22) Filed: Jul. 22, 2010

(65) Prior Publication Data

US 2011/0018044 A1    Jan. 27, 2011

(30) Foreign Application Priority Data

Jul. 23, 2009    (KR) .................... 10-2009-0067120

(51) Int. Cl.
*H01L 29/76*    (2006.01)

(52) U.S. Cl.
USPC ............ 257/288; 257/E21.241; 257/E29.255; 438/724; 438/776; 438/783

(58) Field of Classification Search
USPC ........... 257/288, E21.241, E21.633, E29.255; 438/776, 783, 784, 724
See application file for complete search history.

(56) References Cited

U.S. PATENT DOCUMENTS

| | | | |
|---|---|---|---|
| 2006/0105106 A1* | 5/2006 | Balseanu et al. | ........... 427/248.1 |
| 2008/0138983 A1 | 6/2008 | Lien et al. | |
| 2008/0173908 A1 | 7/2008 | Junker et al. | |
| 2008/0272411 A1* | 11/2008 | Bo et al. | ................ 257/288 |

FOREIGN PATENT DOCUMENTS

KR    1020060128120    12/2006

* cited by examiner

*Primary Examiner* — John C Ingham
(74) *Attorney, Agent, or Firm* — F. Chau & Associates, LLC

(57) ABSTRACT

A semiconductor device includes a MOSFET, and a plurality of stress layers disposed on the MOSFET, wherein the stress layers include a first stress layer disposed on the MOSFET and a second stress layer disposed on the first stress layer, the first stress layer has a first stress and the second stress layer has a second stress, and the first stress is different from the second stress.

23 Claims, 17 Drawing Sheets

ETCH STOP LAYERS AND METHODS OF FORMING THE SAME

CROSS REFERENCE TO RELATED APPLICATION

The present application claims priority to Korean patent application 2009-0067120 filed on Jul. 23, 2009, the entire content of which is incorporated herein by reference.

TECHNICAL FIELD

The present disclosure relates to a metal-oxide-silicon field-effect transistor (MOSFET), and more particularly to a plurality of etch stop layers disposed on a MOSFET.

DISCUSSION OF RELATED ART

A complementary MOS (CMOS) device includes a transistor having a channel region formed between a source region and a drain region. A presence of strain in the channel region causes the individual silicon atoms within the channel region to be forced farther apart or closer together in their lattice structure. The larger or smaller lattice spacing results in a change in the electronic band structure of the CMOS device such that current carriers (i.e., electrons and holes) have higher mobilities within the channel region. As such, a speed of the circuit including the transistor can be improved.

In CMOS devices, strained channel layers may be achieved by imparting local mechanical stress to the device. Contact etch stop layer can be utilized to impart local mechanical stress such as tensile or compressive stresses to the channel region of an re-channel MOS (NMOS) or p-channel MOS (PMOS). In the NMOS, electron mobility can be improved by imparting tensile stress parallel to the direction of current flow or orthogonal to the direction of current flow. In the PMOS, hole mobility can be improved by imparting compressive stress parallel to the direction of current flow, and by imparting tensile stress perpendicular to the direction of current flow.

Accordingly, tensile stress can be imparted to an NMOS channel by applying a tensile etch stop layer, and compressive stress can be imparted to a PMOS channel by applying a compressive etch stop layer. However, stress relaxation occurs in the etch stop layer such that carrier mobilities in the channel region can be decreased.

SUMMARY OF THE INVENTION

Exemplary embodiments of the present invention provide a plurality of etch stop layers (or, stress layers) disposed on a MOSFET. The plurality of etch stop layers include at least one high tensile stress layer and one low tensile stress layer disposed on the high tensile stress layer. The low tensile stress layer prevents stress relaxation of the high tensile stress layer.

According to an exemplary embodiment of the present invention, a semiconductor device comprises a MOSFET, and a plurality of stress layers disposed on the MOSFET, wherein the stress layers include a first stress layer disposed on the MOSFET and a second stress layer disposed on the first stress layer, the first stress layer has a first stress and the second stress layer has a second stress, and the first stress is different from the second stress.

The first stress can be higher than the second stress. The first stress can be about 1.5 Gpa to about 1.7 Gpa tensile stress, and the second stress can be about 1.2 Gpa to about 1.4 Gpa tensile stress.

The first stress can be lower than the second stress. The first stress can be about 1.2 Gpa to about 1.4 Gpa tensile stress, and the second stress can be about 1.5 Gpa to about 1.7 Gpa tensile stress.

The first stress layer and the second stress layer may comprise a same material. The same material can be silicon nitride.

The first stress layer and the second stress layer may comprise a different material.

The first stress layer may comprise silicon nitride and the second stress layer may comprises at least one of silicon or silicon oxide. The first stress layer and the second stress layer may have a substantially same thickness.

The stress layers may further include a third stress layer disposed on the second stress layer and a fourth stress layer disposed on the third stress layer.

The third stress layer may have a third stress and the fourth stress layer may have a fourth stress, and the third stress can be substantially the same as the first stress and the fourth stress can be substantially the same as the second stress.

Each of the first and third stresses can be higher than each of the second and fourth stresses. Each of the first and third stresses can be about 1.5 Gpa to about 1.7 Gpa tensile stress, and each of the second and fourth stresses can be about 1.2 Gpa to about 1.4 Gpa tensile stress.

Each of the first and third stresses can be lower than each of the second and fourth stresses. Each of the first and third stresses can be about 1.2 Gpa to about 1.4 Gpa tensile stress, and each of the second and fourth stresses can be about 1.5 Gpa to about 1.7 Gpa tensile stress.

The first, second, third, and fourth stress layers may comprise a same material. The same material may comprise silicon nitride.

The first and third stress layers may comprise a first material and the second and fourth stress layers may comprise a second material, and the first material and the second material can be different from each other. Each of the first and third stress layers may comprise silicon nitride and each of the second and fourth stress layers may comprise at least one of silicon or silicon oxide.

The first, second, third, and fourth stress layers can be disposed in sequence.

According to an exemplary embodiment of the present invention, a semiconductor device comprises an NMOS and a PMOS, and a plurality of stress layers disposed on the NMOS, wherein the stress layers include a first stress layer disposed on the NMOS and having a first stress, and a second stress layer disposed on the first stress layer and having a second stress, and the first stress is different from the second stress.

The stress layers may further include a third stress layer disposed on the second stress layer and a fourth stress layer disposed on the third stress layer.

The third stress layer may have a third stress and the fourth stress layer may have a fourth stress, and the third stress can be substantially the same as the first stress and the fourth stress can be substantially the same as the second stress.

The stress layers can be disposed on the PMOS.

According to an exemplary embodiment of the present invention, a method of forming a semiconductor device comprises forming a metal-oxide-silicon field-effect transistor (MOSFET), forming a first stress layer having a first stress on the MOSFET, and forming a second stress layer having a second stress on the first stress layer, wherein the first stress is different from the second stress.

Forming the first stress layer may comprise depositing a first silicon nitride layer under a first pressure, and forming the second stress layer may comprise depositing a second silicon nitride layer under a second pressure, wherein the first pressure can be higher than the second pressure.

Forming the first stress layer may comprise depositing a first silicon nitride layer, and forming the second stress layer may comprise converting a surface of the first silicon nitride layer into a second silicon nitride layer using an $N_2$ plasma process.

Forming the first stress layer may comprise depositing a first silicon nitride layer, and forming the second stress layer may comprise depositing a second silicon nitride layer and performing an $N_2$ plasma process over the second silicon nitride layer.

Forming the first stress layer may comprise depositing a silicon nitride layer, and forming the second stress layer may comprise depositing at least one of a silicon layer or a silicon oxide layer.

The first pressure can be about 5 Torr to about 10 Torr, and the second pressure can be about 2 Torr to about 4 Torr.

The method may further comprise forming a third stress layer on the second stress layer and forming a fourth stress layer on the third stress layer, wherein the third stress layer has a third stress which is substantially the same as the first stress and the fourth stress layer has a fourth stress which is substantially the same as the second stress.

According to an exemplary embodiment of the present invention, a semiconductor device comprises a MOSFET, and a plurality of stress layers disposed on the MOSFET, wherein the stress layers include a pair of stress layers having a first stress layer and a second stress layer disposed on the first stress layer, the first stress layer having a first stress and the second stress layer having a second stress which is lower than the first stress, and the pair of stress layers repeatedly stacked on top of each other.

The first stress can be about 1.5 Gpa to about 1.7 Gpa tensile stress, and the second stress can be about 1.2 Gpa to about 1.4 Gpa tensile stress.

BRIEF DESCRIPTION OF DRAWINGS

Exemplary embodiments of the present invention can be understood in more detail from the following descriptions taken in conjunction with the accompanying drawings, in which.

DESCRIPTION OF EXEMPLARY EMBODIMENTS

The present invention will now be described more fully with reference to the accompanying drawings in which example embodiments of the invention are shown. This invention may, however, be embodied in many different forms and should not be construed as limited to the exemplary embodiments set forth herein.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the exemplary embodiments.

Figure 1:
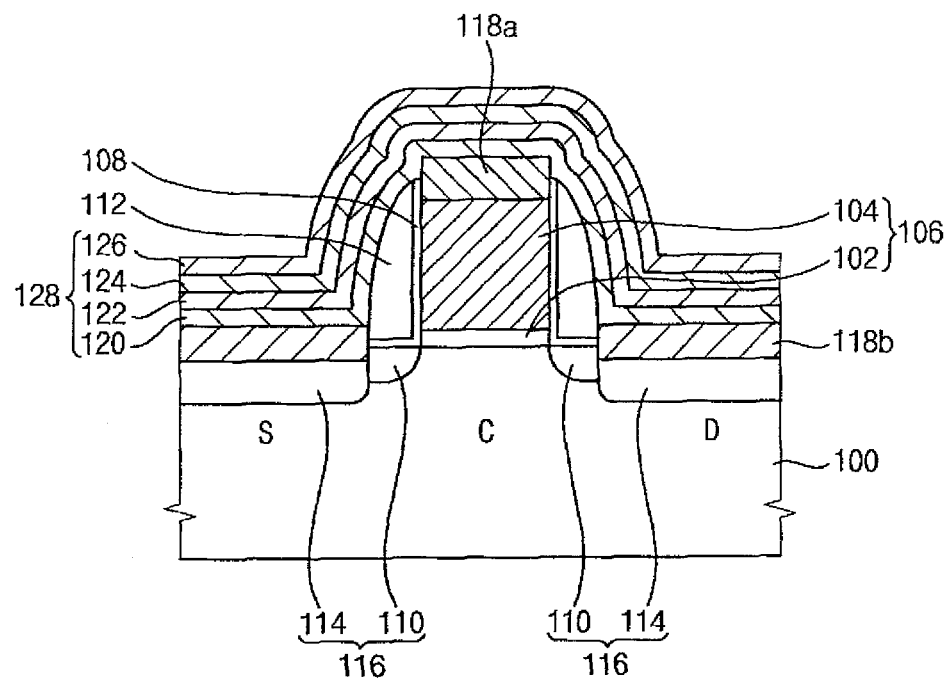
FIG. 1 is a cross-sectional view of a semiconductor device according to an exemplary embodiment of the present invention.

FIG. 1 is a cross-sectional view of a semiconductor device according to an exemplary embodiment of the present invention. Referring to FIG. 1, a plurality of stress layers 128 are disposed on a MOSFET. The plurality of stress layers 128 can function as etch stop layers in a semiconductor manufacturing process. The plurality of stress layers 128 include a first stress layer 120, a second stress layer 122 disposed on the first stress layer 120, a third stress layer 124 disposed on the second stress layer 122, and a fourth stress layer 126 disposed on the third stress layer 124. The MOSFET may include, for example, a MOS capacitor, spacers 108, 112, impurity regions 116, and metal silicide patterns 118a, 118b. The MOS capacitor includes a gate 106 comprising a gate electrode 104 and an oxide layer 102, and a channel region C. The impurity region 116 may include a source region S and a drain region D. Each of the source and drain regions S, D may include a lowly doped region 110 and a highly doped region 114.

The first metal silicide pattern 118a and the second metal silicide pattern 118b can be respectively formed on the gate electrode 104 and the highly doped region 118b. An offset spacer 108 and a spacer 112 can be formed on the lowly doped region 110 and can be formed between the first stress layer 120 and the gate 106. As such, in an exemplary embodiment, the first stress layer 120 can be formed on the second metal silicide pattern 118b, the offset spacer 108, the spacer 112, and the first metal silicide layer 118a.

The first, second, third and fourth stress layers 120, 122, 124 and 126 respectively have a first, second, third, and fourth stress. The first stress is different from the second stress. The third stress is different from the fourth stress. In an exemplary embodiment, each of the first, second, third, and fourth stress layers 120, 122, 124 and 126 can have a thickness of about 10 nm to about 15 nm.

In an exemplary embodiment, the first stress can be higher than the second stress. The first stress can be about 1.5 Gpa to about 1.7 Gpa tensile stress. The second stress can be about 1.2 Gpa to about 1.4 Gpa tensile stress. The third stress can be higher than the fourth stress. The third stress can be about 1.5 Gpa to about 1.7 Gpa tensile stress. The fourth stress can be about 1.2 Gpa to about 1.4 Gpa tensile stress. The first tensile stress can be substantially the same as the third tensile stress, and the second tensile stress can be substantially the same as the fourth tensile stress. As such, one pair or more than one pair of a high tensile stress layer and a low tensile stress layer can be repeatedly stacked on top of each other. Accordingly, stress relaxation of the first and third stress layers 120, 124 comprising high tensile stress layers can be prevented by the second and fourth stress layers 122, 126 comprising low tensile stress layers.

According to an exemplary embodiment of the present invention, a low tensile stress layer prevents a high tensile stress layer from being retracted. As such, a stress relaxation can be prevented. This causes a stronger tensile stress applied to a channel region, which is formed between the source and drain regions. Accordingly, the carrier mobility in the channel region can be improved. Although an exemplary embodiment described in connection with FIG. 1 shows four of the stress layers, different numbers of stress layers can also be disposed as long as a lower tensile stress layer prevents a higher tensile stress layer from the stress relaxation. In an exemplary embodiment, an odd number of stress layers can be stacked on top of each other.

A various method of forming a high-low-high-low tensile stress layers combination can be used according to an exemplary embodiment of the present invention. In an exemplary embodiment, each of the first, second, third, and fourth stress layers 120, 122, 124, and 126 comprises a same material such as, for example, silicon nitride. The first stress layer 120 can have a tensile stress higher than the tensile stress of the second stress layer 122 when the first stress layer 120 is formed under a higher pressure than the second stress layer 122. Alternatively, the first stress layer 120 can have a tensile stress higher than the tensile stress of the second stress layer 122 when a surface of the first stress layer 120 is converted into the second stress layer 122 comprising silicon nitride using an $N_2$ plasma process. Alternatively, the first stress layer 120 can have a tensile stress higher than the tensile stress of the second stress layer 122 when an $N_2$ plasma process is performed over the second stress layer 122 comprising silicon nitride. Similar methods can be performed with respect to the third and fourth stress layers 124, 126 to form stress layers with different tensile stresses.

In an exemplary embodiment, the first stress can be lower than the second stress. The first stress can be about 1.2 Gpa to about 1.4 Gpa tensile stress. The second stress can be about 1.5 Gpa to about 1.7 Gpa tensile stress. The third stress can be lower than the fourth stress. The third stress can be about 1.2 Gpa to about 1.4 Gpa tensile stress. The fourth stress can be about 1.5 Gpa to about 1.7 Gpa tensile stress. As such, one pair or more than one pair of a low tensile stress layer and a high tensile stress layer are repeatedly stacked on top of each other. According to an exemplary embodiment of the present invention, stress relaxation of the second and fourth stress layers 122, 126 comprising high tensile stress layers can be prevented by the first and third stress layers 120, 124 comprising low tensile stress layers. As such, a low-high-low-high tensile stress layers combination can be formed.

FIG. 2 through FIG. 5 show a method of manufacturing a semiconductor device according to an exemplary embodiment of the present invention.

Figure 2:
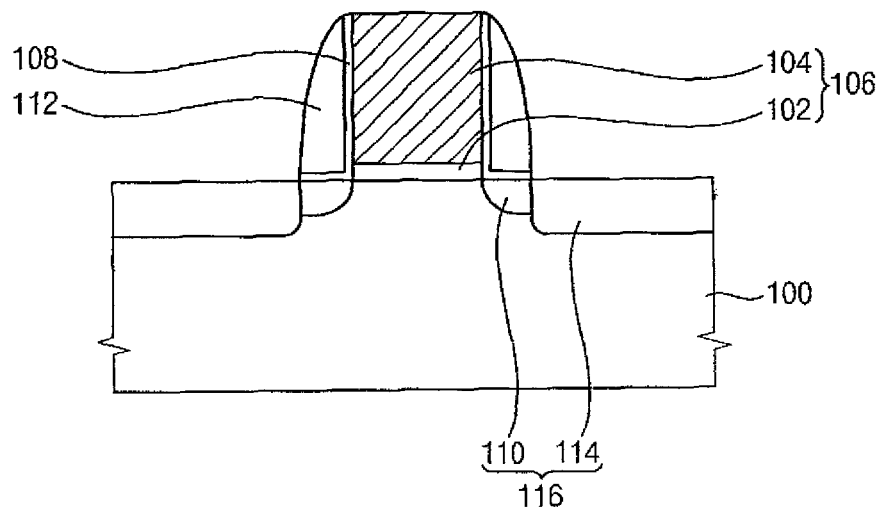
FIG. 2 through FIG. 5 show a method of manufacturing a semiconductor device according to an exemplary embodiment of the present invention.

Referring to FIG. 2, a semiconductor substrate 100 is provided. The gate 106 including the gate electrode 104 and the oxide pattern 102 is formed on the substrate 100. The lowly doped region 110 of the substrate 100 is formed adjacent to the gate 106. The offset spacer 108 is formed on a sidewall of the gate electrode 104. The offset spacer 108 is also formed on the lowly doped region 110. As such, according to an exemplary embodiment of the present invention, in sectional view, the offset spacer 108 can have a substantially L shape. Along the sides of the L-shaped offset spacer 108, a spacer 112 can be disposed thereon.

Figure 3:
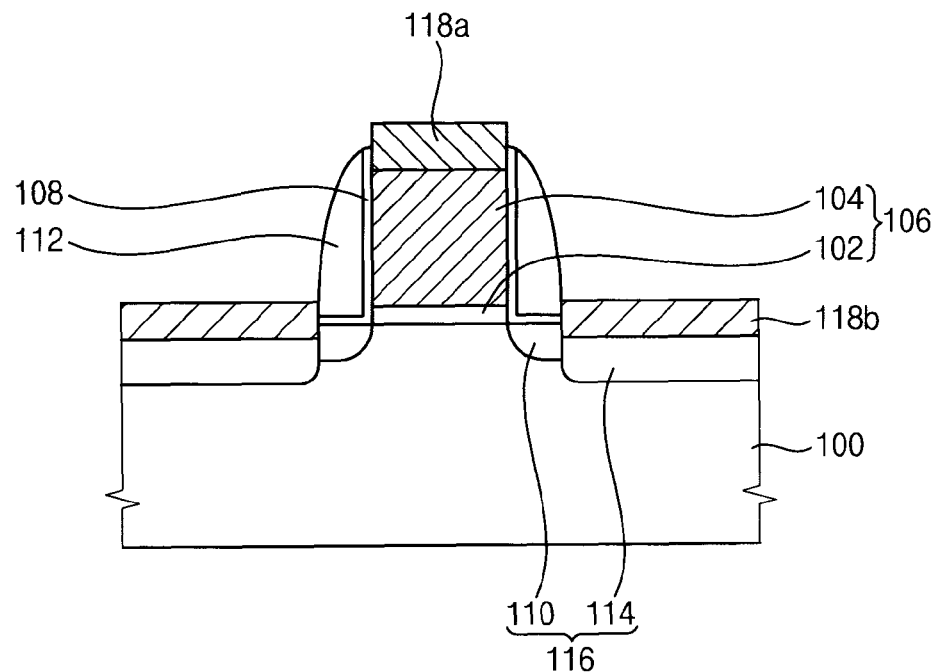

Referring to FIG. 3, a highly doped region 114 of the substrate 100 is formed adjacent to the lowly doped region 110. As such, according to an exemplary embodiment of the present invention, the impurity region 116 including the lowly doped region 110 and the highly doped region 114 can be formed around the gate 106. The first silicide pattern 118a is formed on the gate electrode 104. The second silicide pattern 118b is formed on the highly doped region 114.

Figure 4:
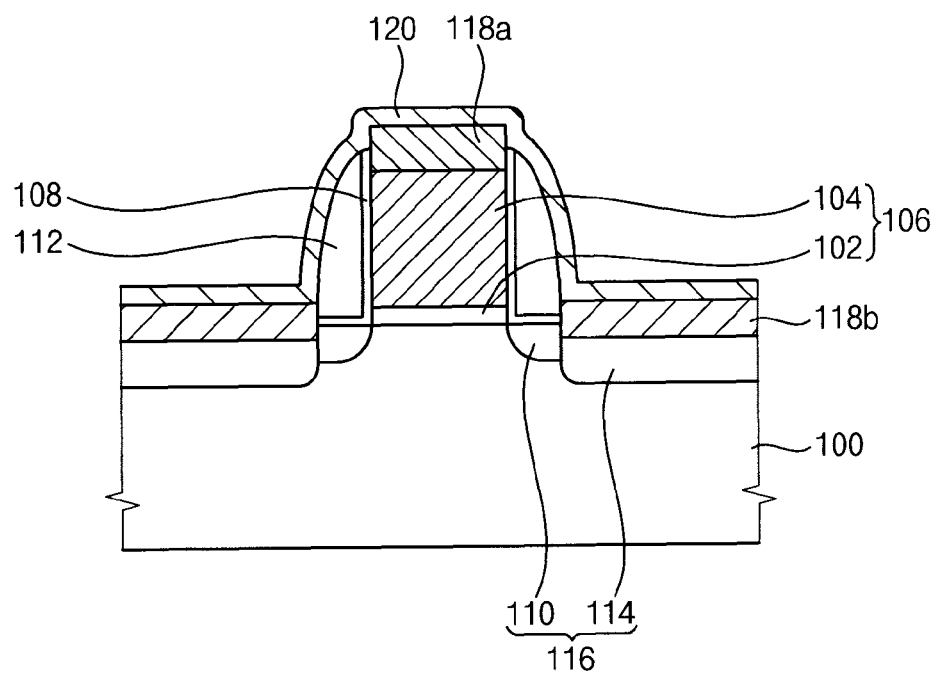
Figure 21:
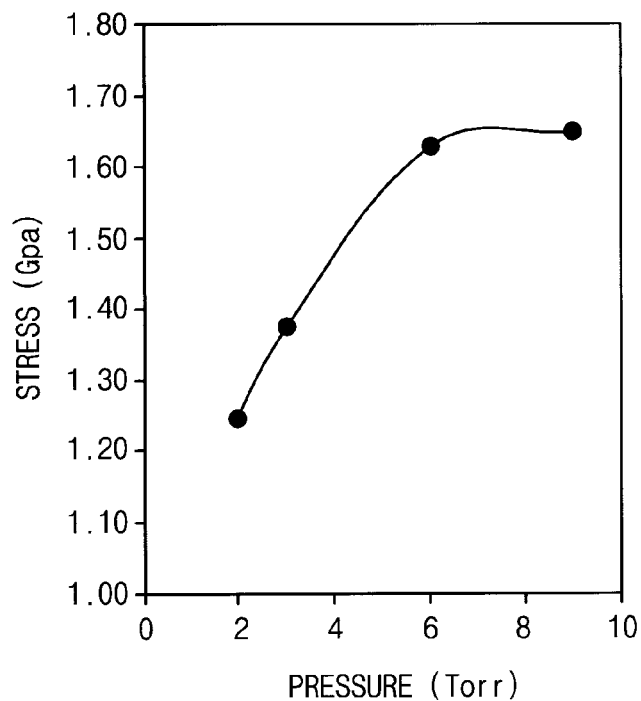
FIG. 21 shows a tensile stress of a silicon nitride layer with respect to a pressure applied to a silicon nitride layer according to an exemplary embodiment of the present invention.

Referring to FIGS. 4 and 21, the first stress layer 120 is formed, for example, conformally on the MOS transistor including the silicide patterns 118a and 118b and the spacer 112. In an exemplary embodiment, the first stress layer 120 comprising silicon nitride can be formed using a PECVD process under a chamber pressure of about 5 Torr to about 10 Torr and under a chamber temperature of about 300° C. to about 600° C. As such, the first stress layer 120 can have about 1.5 Gpa to about 1.7 Gpa tensile stress.

Figure 5:
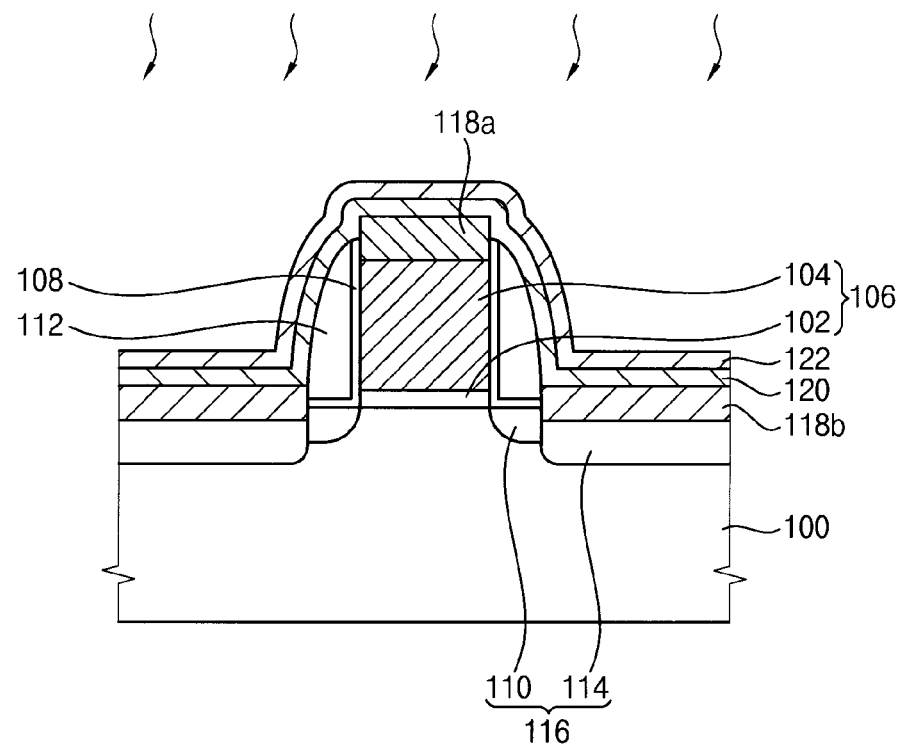

Referring to FIGS. 5 and 21, the second stress layer 122 comprising silicon nitride is formed on the first stress layer 120 comprising silicon nitride. In an exemplary embodiment, the second stress layer 122 can be formed using a PECVD process under a chamber pressure of about 2 Torr to about 4 Torr and under a chamber temperature of about 300° C. to about 600° C. As such, the second stress layer 122 comprising silicon nitride can have about 1.2 Gpa to about 1.4 Gpa tensile stress. Thus, the second stress layer 122 has a lower tensile stress than the first stress layer 120.

In an exemplary embodiment, a UV treatment can be optionally performed to the first and second stress layers 120, 122. With the UV treatment to the first and second stress layers 120, 122, the tensile stress applied to the channel region of the substrate can be increased. In the UV treatment, a wavelength of about 100 nm to about 400 nm UV can be used. The UV treatment can be performed under the temperature of about 300° C. to about 600° C. The UV treatment can be omitted according to an exemplary embodiment of the present invention.

In an exemplary embodiment, a stress memorization technique (SMT) can be performed on the channel region of the substrate 100 before forming the metal silicide patterns 118a, 118b on the gate 106 and the impurity regions 116, respectively. For example, a pair of silicon nitride layers having different tensile stresses are repeatedly formed on top of each other on the gate 106 and the substrate 100. After a heat treatment to the repeated pair of silicon nitride layers, the repeated pair of silicon nitride layers are removed. The SMT can be omitted according to an exemplary embodiment of the present invention.

Referring to FIGS. 1, 5 and 21, using a substantially similar method as provide above, the third and fourth stress layers 124, 126 having different tensile stresses with each other can be formed. For example, the third stress layer 124 comprising silicon nitride can be formed on the second stress layer 122 comprising silicon nitride. In an exemplary embodiment, the third stress layer 124 can be formed using a PECVD process under a chamber pressure of about 5 Torr to about 10 Torr and under a chamber temperature of about 300° C. to about 600° C. As such, the third stress layer 124 comprising silicon nitride can have about 1.5 Gpa to about 1.7 Gpa tensile stress. The fourth stress layer 126 comprising silicon nitride can be formed on the third stress layer 124 comprising silicon nitride. In an exemplary embodiment, the fourth stress layer 126 can be formed using a PECVD process under a chamber pressure of about 2 Torr to about 4 Torr and under a chamber temperature of about 300° C. to about 600° C. As such, the fourth stress layer 126 comprising silicon nitride can have about 1.2 Gpa to about 1.4 Gpa tensile stress. Thus, the fourth stress layer 126 has a lower tensile stress than the third stress layer 124.

Figure 6:
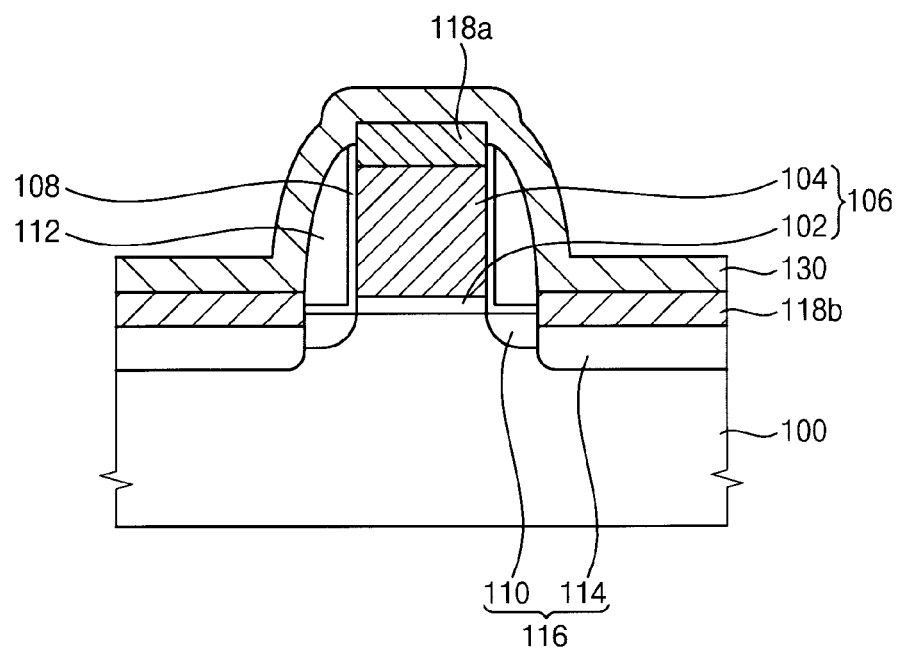
FIGS. 6 and 7 show a method of forming first and second stress layers having different tensile stresses according to an exemplary embodiment of the present invention.
Figure 7:
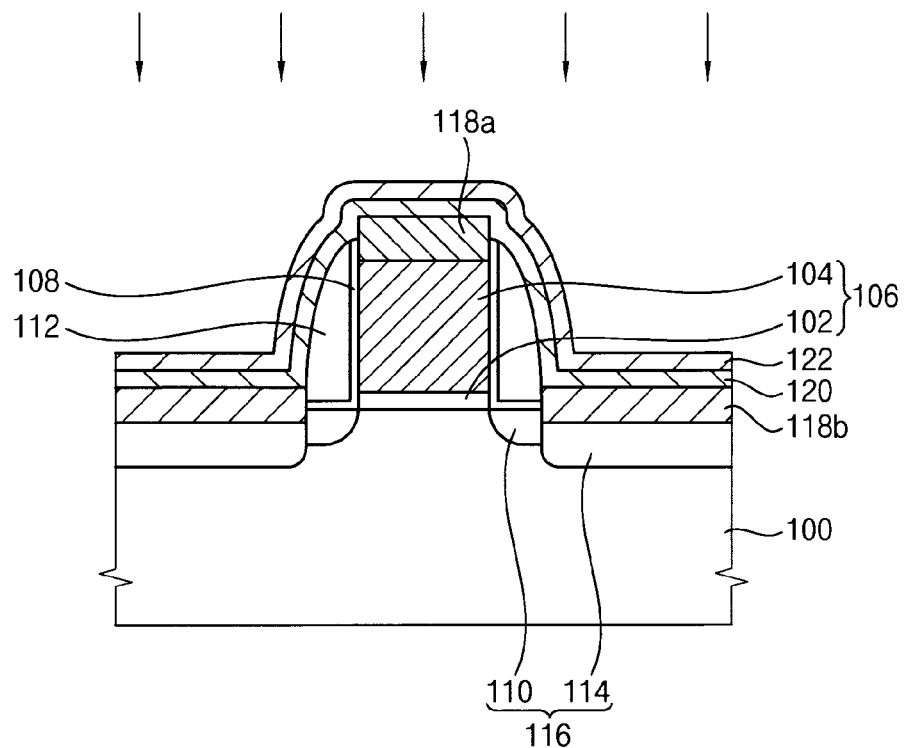

FIGS. 6 and 7 show a method of forming the first and second stress layers 120 and 122 having different tensile stresses according to an exemplary embodiment of the present invention.

Referring to FIGS. 6 and 21, a preliminary silicon nitride layer 130 can be formed on the MOSFET. In an exemplary embodiment, the preliminary silicon nitride layer 130 can be formed using a PECVD process under a chamber pressure of about 5 Torr to about 10 Torr and under a chamber temperature of about 300° C. to about 600° C. As such, the preliminary silicon nitride layer 130 can have about 1.5 Gpa to about 1.7 Gpa tensile stress. The preliminary silicon nitride layer 130 can have a thickness which is thicker than the first stress layer 120. In an exemplary embodiment, the preliminary silicon nitride layer 130 can be about two times thicker than the first stress layer 120. A thickness of the preliminary silicon nitride layer can be about 20 nm to about 30 nm. A thickness of the first stress layer can be about 10 nm to about 15 nm.

Referring to FIG. 7, an $N_2$ plasma process is performed on the preliminary silicon nitride layer 130 to convert a surface of the preliminary silicon nitride layer 130 into another silicon nitride layer. As a result, the surface of the preliminary silicon nitride layer 130 is converted into another silicon nitride layer which has a thickness substantially the same as the thickness of the second stress layer 122. The converted surface has a tensile stress smaller than that of the non converted preliminary silicon nitride layer 130. During the $N_2$ plasma process, silicon and nitrogen can be combined and hydrogen escapes from the surface of the preliminary silicon nitride layer 130. As such, the surface of the preliminary silicon nitride layer 130 can have a dense structure.

In an exemplary embodiment, to form a pair of layers having different tensile stresses, the $N_2$ plasma process can be performed over the second stress layer 122 comprising silicon nitride. For example, the second stress layer 122 comprising silicon nitride is formed on the first stress layer 120 comprising silicon nitride. Then, the $N_2$ plasma is performed over the second silicon nitride layer. As a result, the second silicon nitride layer has a lower tensile stress than the first silicon nitride layer.

Figure 8:
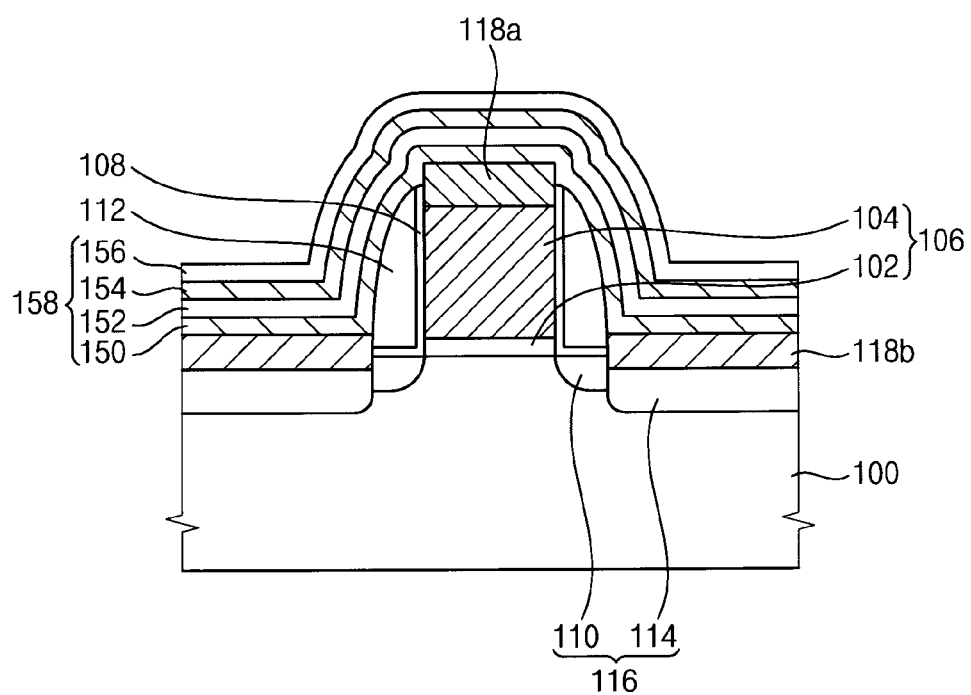
FIG. 8 shows a cross-sectional view of a semiconductor device according to an exemplary embodiment of the present invention.

FIG. 8 shows a cross-sectional view of a semiconductor device according to an exemplary embodiment of the present invention.

Referring to FIG. 8, a plurality of stress layers 158 are formed on the MOSFET. The plurality of stress layers 158 include a first stress layer 150, a second stress layer 152, a third stress layer 154, and a fourth stress layer 156. In an exemplary embodiment, the first and third stress layers 150, 154 comprise silicon nitride and the second and fourth stress layers 152, 156 comprise at least one of silicon or silicon oxide. The first stress layer 150 and the second stress layer 152 have different tensile stresses when each stress layer comprises different materials. The first stress layer 150 comprising silicon nitride has a higher tensile stress than the seconds stress layer 152 comprising silicon oxide or silicon. As such, a tensile stress applied to the substrate 100 can be maximized. In an exemplary embodiment, each thickness of the first and third stress layers 150, 154 comprising silicon nitride is substantially the same as each thickness of the second and fourth stress layers 152, 156 comprising at least one of silicon or silicon oxide. In an exemplary embodiment, each thickness can be about 10 nm to about 15 nm.

Figure 9:
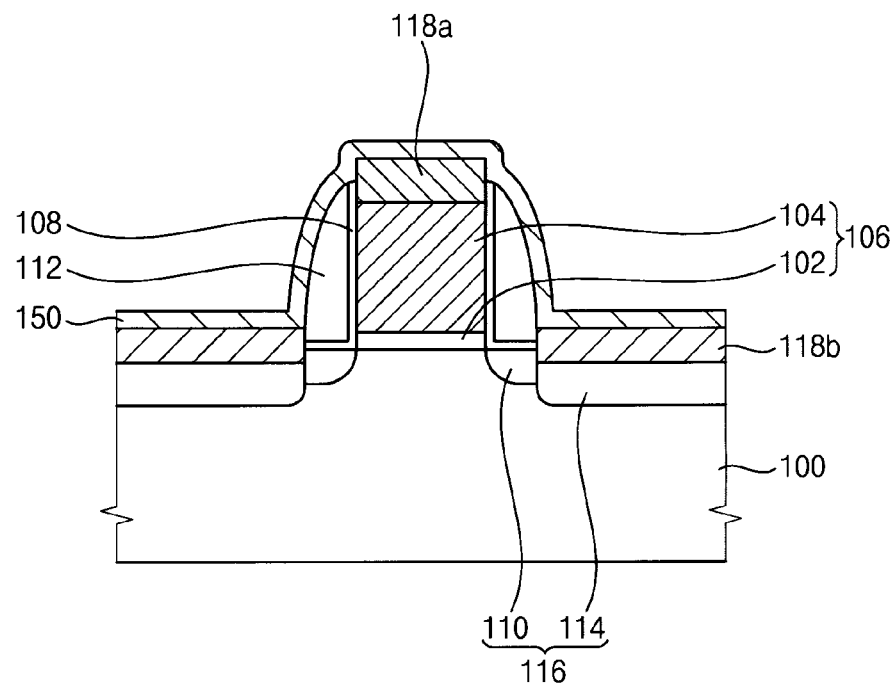
FIGS. 9 and 10 show a method of forming first and second stress layers having different tensile stresses according to an exemplary embodiment of the present invention.
Figure 10:
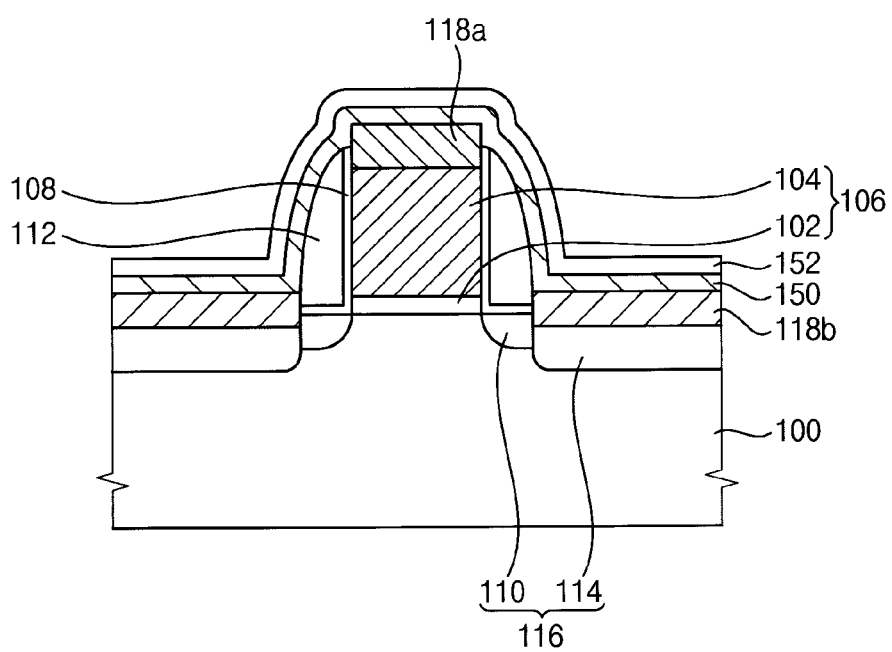

FIGS. 9 and 10 show a method of forming first and second stress layers 150 and 152 having different tensile stresses according to an exemplary embodiment of the present invention.

Referring to FIGS. 9 and 21, a first stress layer 150 comprising silicon nitride is formed, for example, conformally on the silicide patterns 118a and 118b and the spacer 112. In an exemplary embodiment, the first stress layer 150 can be formed using a PECVD process under a chamber pressure of about 2 Torr to about 10 Torr and under a chamber temperature of about 300° C. to about 600° C. As such, the first stress layer 150 comprising silicon nitride can have about 1.2 Gpa to about 1.7 Gpa tensile stress. In an exemplary embodiment, the first stress layer 150 comprising silicon nitride can have about 1.5 Gpa to about 1.7 Gpa.

Referring to FIG. 10, a second stress layer 152 as a buffer layer can be formed on the first stress layer 150 comprising silicon nitride. As an example of the buffer layer, a silicon oxide layer, a silicon layer, or a silicon oxynitride layer can be used. In an exemplary embodiment, the buffer layer can be formed using a PECVD process in less than about 500° C. The buffer layer 152 has a lower tensile stress than the first stress layer 150. The buffer layer 152 prevents the first stress layer 150 having a higher tensile stress from being retracted. As such, a tensile stress applied to the substrate 100 can be maximized. Referring to FIGS. 8 and 10, the third and fourth stress layers 154, 156 can be formed with a substantially similar method as provided above in connection with forming the first and second stress layers 150, 152.

Figure 11:
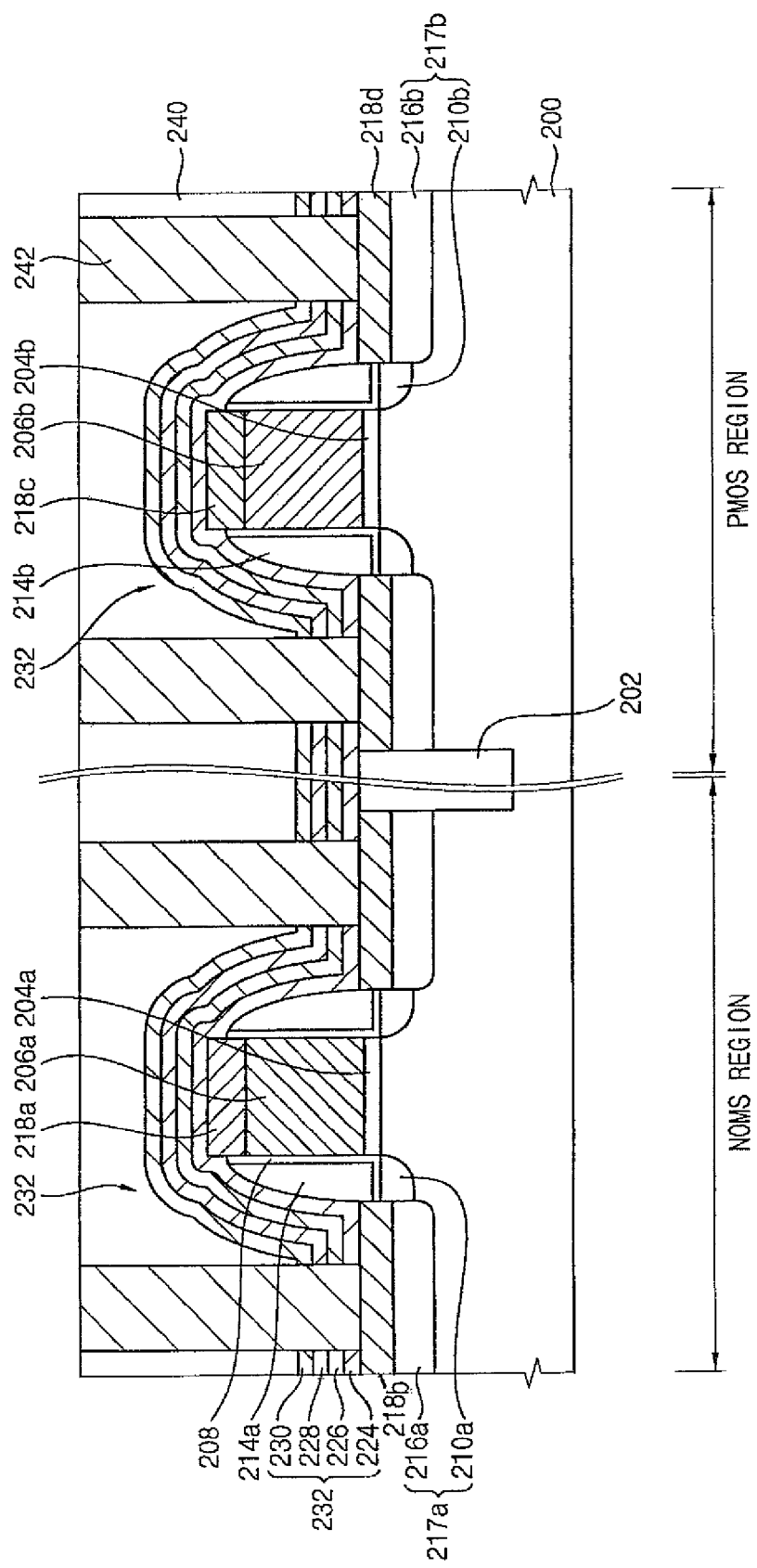
FIG. 11 shows a cross-sectional view of a semiconductor device according to an exemplary embodiment of the present invention.

FIG. 11 shows a cross-sectional view of a semiconductor device according to an exemplary embodiment of the present invention.

Referring to FIG. 11, a semiconductor device includes an NMOS in an NMOS region and a PMOS in a PMOS region. The NMOS and the PMOS are disposed adjacent to each other to form a CMOS. A plurality of stress layers 232 cover the NMOS. The plurality of stress layers 232 include a first stress layer 224, a second stress layer 226, a third stress layer 228, and a fourth stress layer 230.

The NMOS includes an NMOS capacitor comprising a gate electrode 206a, an oxide pattern 204a, and a channel region formed between a source region and a drain region. The source region can be an impurity region 217a including a lowly doped region 210a and a highly doped region 216a. A first metal silicide pattern 218a and a second metal silicide pattern 218b can be respectively formed on the gate electrode 206a and the highly doped region 216a. An offset spacer 208 and a spacer 214a can be formed on the lowly doped region 210a and can be formed between the first stress layer 224 and the gate electrode 206a. As such, in an exemplary embodiment, the first stress layer 224 can be formed on the second metal silicide pattern 218b, the offset spacer 208, the spacer 214a, and the first metal silicide layer 218a. A contact stud 242 can be formed through an insulating layer 240 and the plurality of stress layers 232 to contact the second metal silicide pattern 218b.

Referring to FIG. 11, the first stress layer 224 is disposed on the NMOS and has a first stress. The second stress layer 226 is disposed on the first stress layer 224 and has a second stress. The first stress can be different from the second stress. In an exemplary embodiment, the first stress is higher than the second stress. The third stress layer 228 is disposed on the second stress layer 226 and has a third stress. The fourth stress layer 230 is disposed on the third stress layer 228 and has a fourth stress. In an exemplary embodiment, the third stress can be substantially the same as the first stress, and the fourth stress can be substantially the same as the second stress.

In the PMOS region, a PMOS including an impurity region 217b, a gate electrode 206b, an oxide pattern 204b, a spacer 214b, a first silicide pattern 218c, and a second silicide pattern 218d is formed. The impurity region 217b includes a lowly doped region 210b and a highly doped region 216b. An isolation trench 202 can be formed between the NMOS region and the PMOS region. According to an exemplary embodiment, the plurality of stress layers 232 are not disposed on the PMOS. Alternatively, the plurality of stress layers 232 can be disposed on the PMOS.

Figure 12:
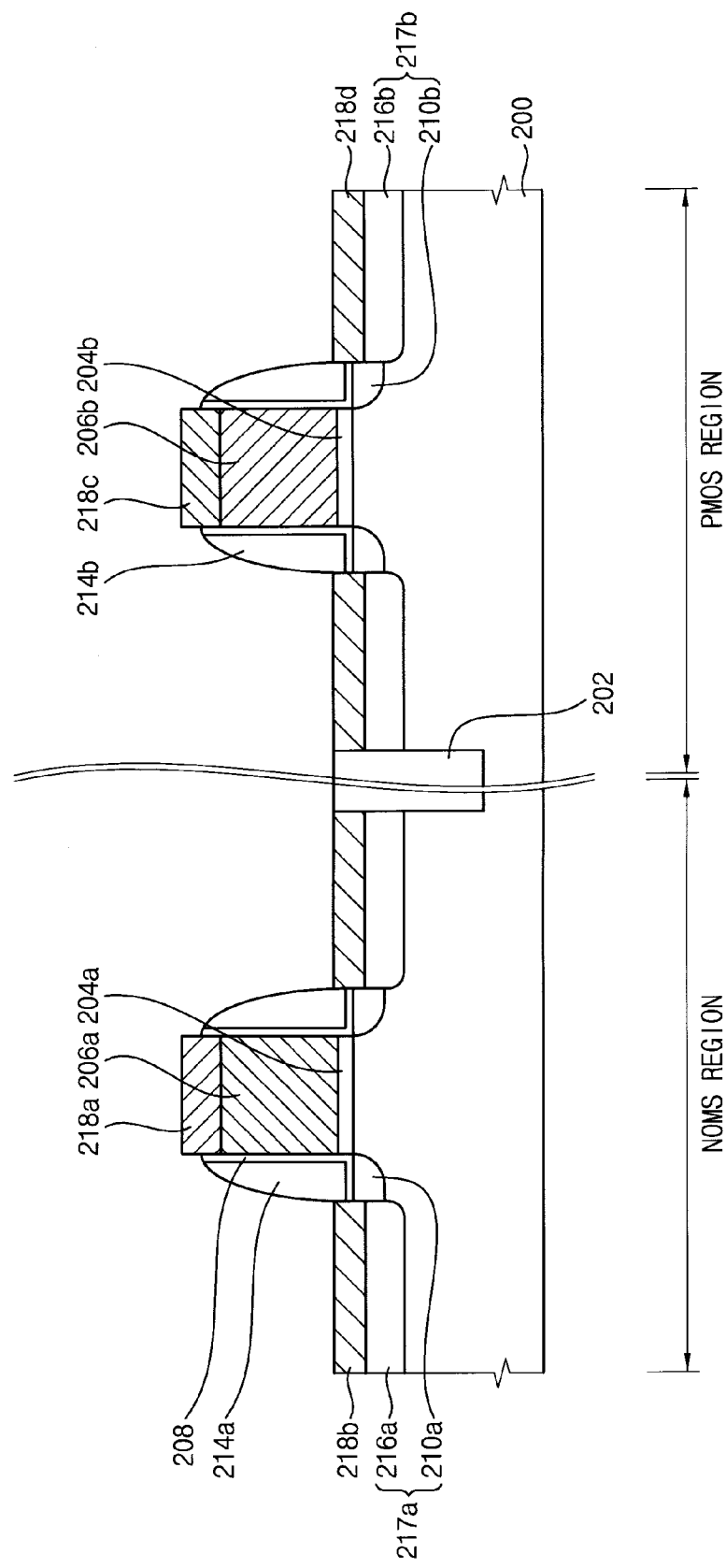
FIGS. 12 through 14 show a method of forming a semiconductor device according to an exemplary embodiment of the present invention.
Figure 13:
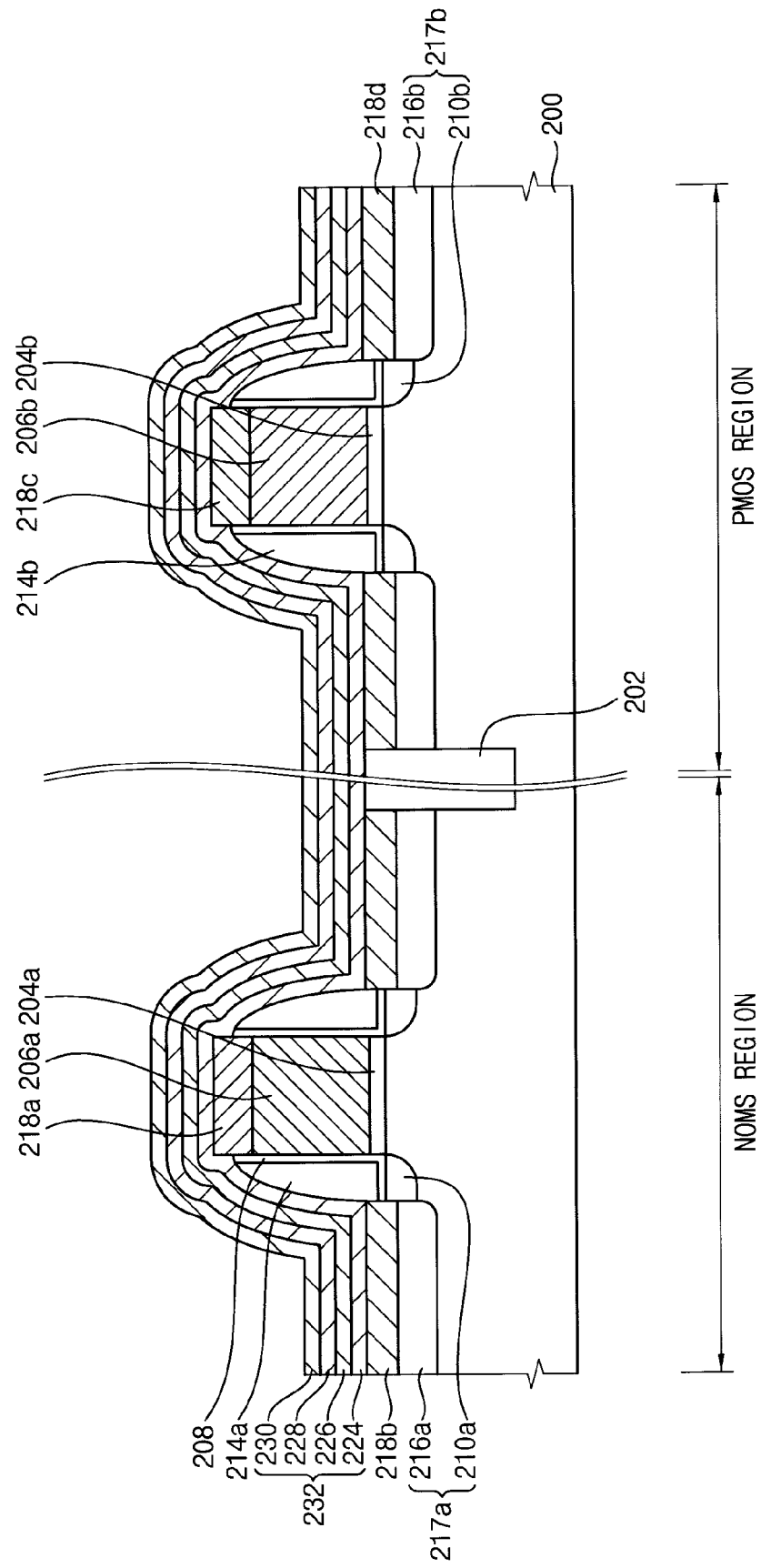
Figure 14:
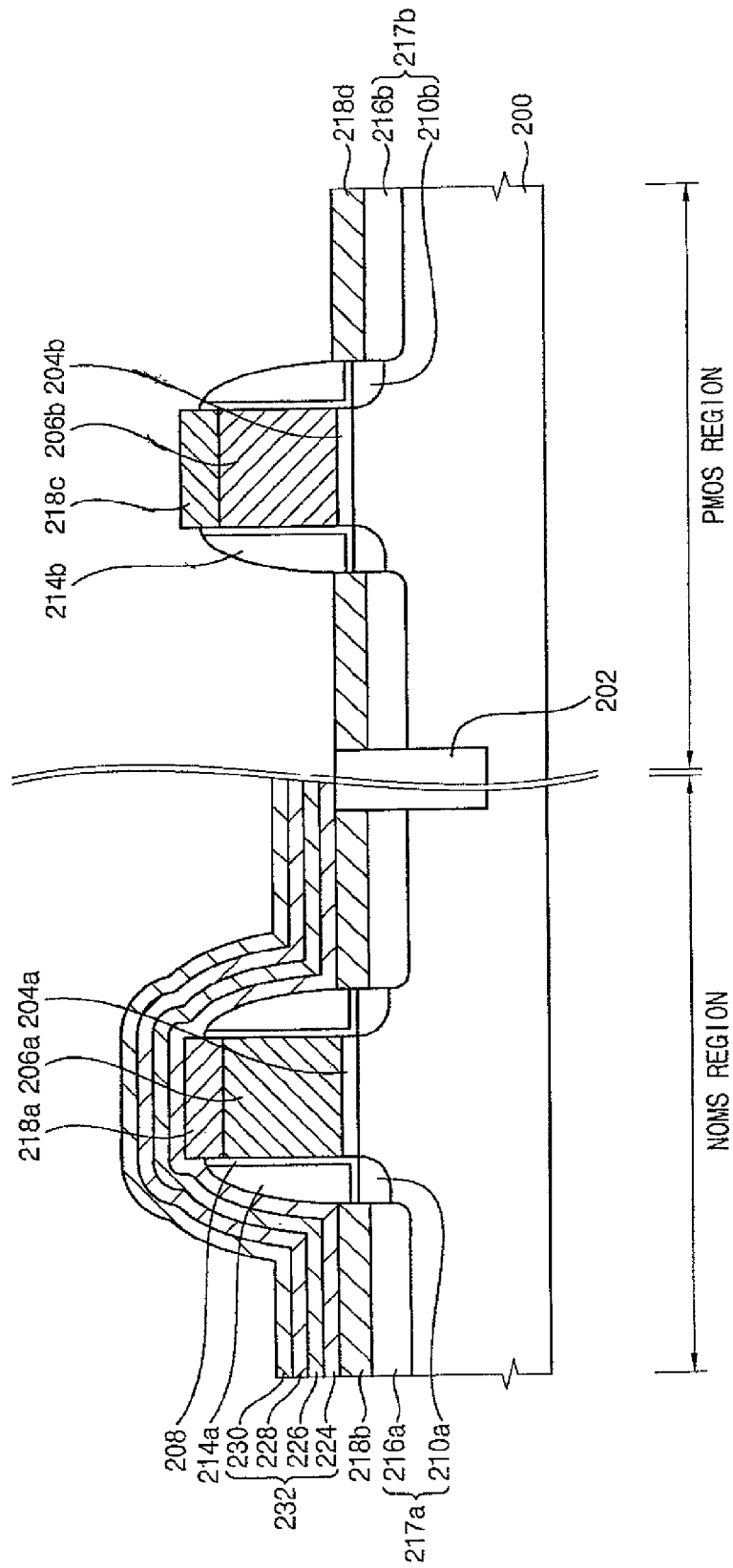

FIGS. 12 through 14 show a method of forming a semiconductor device according to an exemplary embodiment of the present invention.

Referring to FIG. 12, a semiconductor substrate 200 is provided. The gate electrodes 206a, 206b and the oxide patterns 204a, 204b are formed respectively in the NMOS region and the PMOS region on the substrate 200. The lowly doped regions 210a, 210b of the substrate 200 are formed adjacent to the gate electrodes 206a, 206b, respectively. The offset spacers 208 are formed on respective sidewalls of the gate electrodes 206a, 206b. The offset spacers 208 are also formed on the lowly doped regions 210a, 210b. As such, according to an exemplary embodiment of the present invention, in sectional view, the offset spacers 208 can have a substantially L shape. Along the sides of the L-shaped offset spacers 208, respective spacers 214a, 214b can be disposed thereon. The highly doped regions 216a, 216b of the substrate 200 are formed adjacent to the lowly doped regions 210a, 210b, respectively. As such, according to an exemplary embodiment of the present invention, the impurity regions 217a, 217b can be formed around the respective gate electrodes 206a, 206b. The first silicide patterns 218a, 218c are formed on the gate electrodes 206a, 206b, respectively. The second silicide patterns 218b, 218d are formed on the highly doped regions 216a, 216b, respectively.

Referring to FIGS. 13 and 21, the first stress layer 224 is formed, for example, conformally on the NMOS and PMOS. In an exemplary embodiment, the first stress layer 224 comprising silicon nitride can be formed using a PECVD process under a chamber pressure of about 5 Torr to about 10 Torr and under a chamber temperature of about 300° C. to about 600° C. As such, the first stress layer 224 can have about 1.5 Gpa to about 1.7 Gpa tensile stress. The second stress layer 226 comprising silicon nitride is formed on the first stress layer 224 comprising silicon nitride. In an exemplary embodiment, the second stress layer 226 can be formed using a PECVD process under a chamber pressure of about 2 Torr to about 4 Torr and under a chamber temperature of about 300° C. to about 600° C. As such, the second stress layer 226 comprising silicon nitride can have about 1.2 Gpa to about 1.4 Gpa tensile stress. Thus, the second stress layer 226 has a lower tensile stress than the first stress layer 224.

Using a substantially similar method as provided above, the third and fourth stress layers 228, 230 having different tensile stresses with each other can be formed. For example, the third stress layer 228 comprising silicon nitride can be formed on the second stress layer 226 comprising silicon nitride. In an exemplary embodiment, the third stress layer 228 can be formed using a PECVD process under a chamber pressure of about 5 Torr to about 10 Torr and under a chamber temperature of about 300° C. to about 600° C. As such, the third stress layer 226 comprising silicon nitride can have about 1.5 Gpa to about 1.7 Gpa tensile stress. The fourth stress layer 230 comprising silicon nitride can be formed on the third stress layer 228 comprising silicon nitride. In an exemplary embodiment, the fourth stress layer 230 can be formed using a PECVD process under a chamber pressure of about 2 Torr to about 4 Torr and under a chamber temperature of about 300° C. to about 600° C. As such, the fourth stress layer 230 comprising silicon nitride can have about 1.2 Gpa to about 1.4 Gpa tensile stress. Thus, the fourth stress layer 230 has a lower tensile stress than the third stress layer 228.

Referring to FIG. 14, the plurality of stress layers 232 are removed from the PMOS area. Alternatively, in a <100> wafer, the plurality of stress layers 232 can remain on the PMOS area. This is because in the <100> wafer the PMOS is not sensitive to a tensile stress from the stress layers 232.

FIGS. 15 through 19 are flowcharts showing methods of forming a plurality of stress layers in a semiconductor device according to exemplary embodiments of the present invention.

Figure 15:
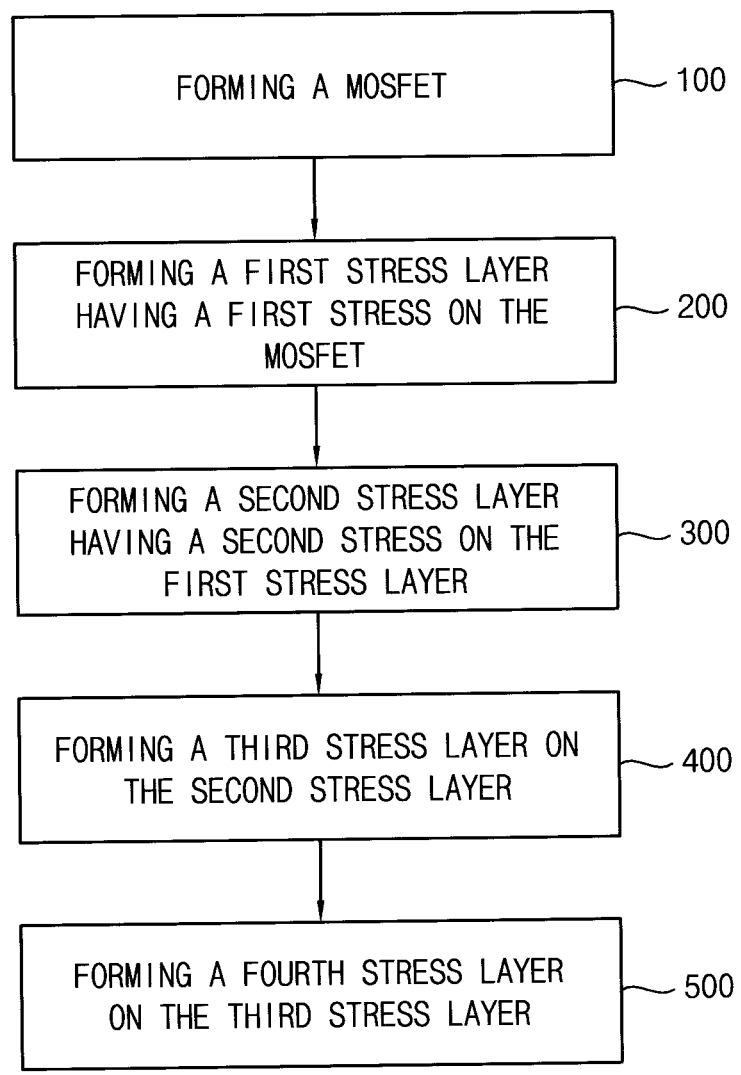
FIGS. 15 through 19 are flowcharts showing methods of forming a plurality of stress layers in a semiconductor device according to exemplary embodiments of the present invention.
Figure 16:
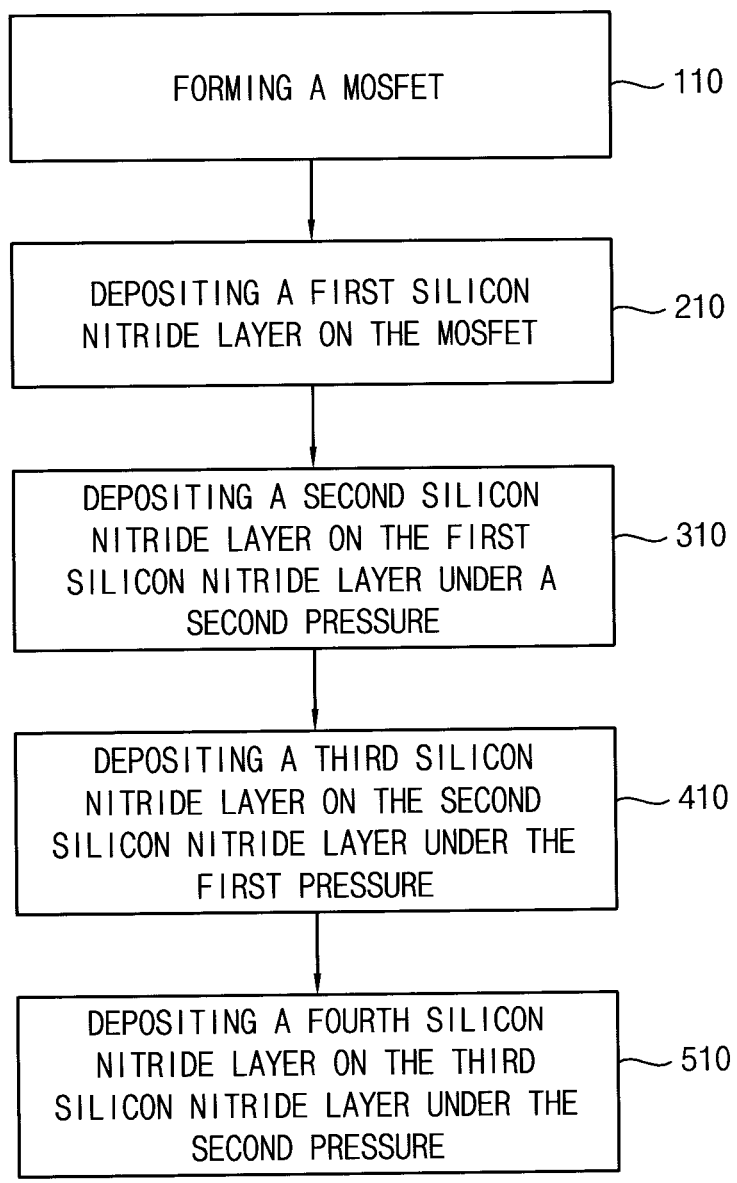
Figure 17:
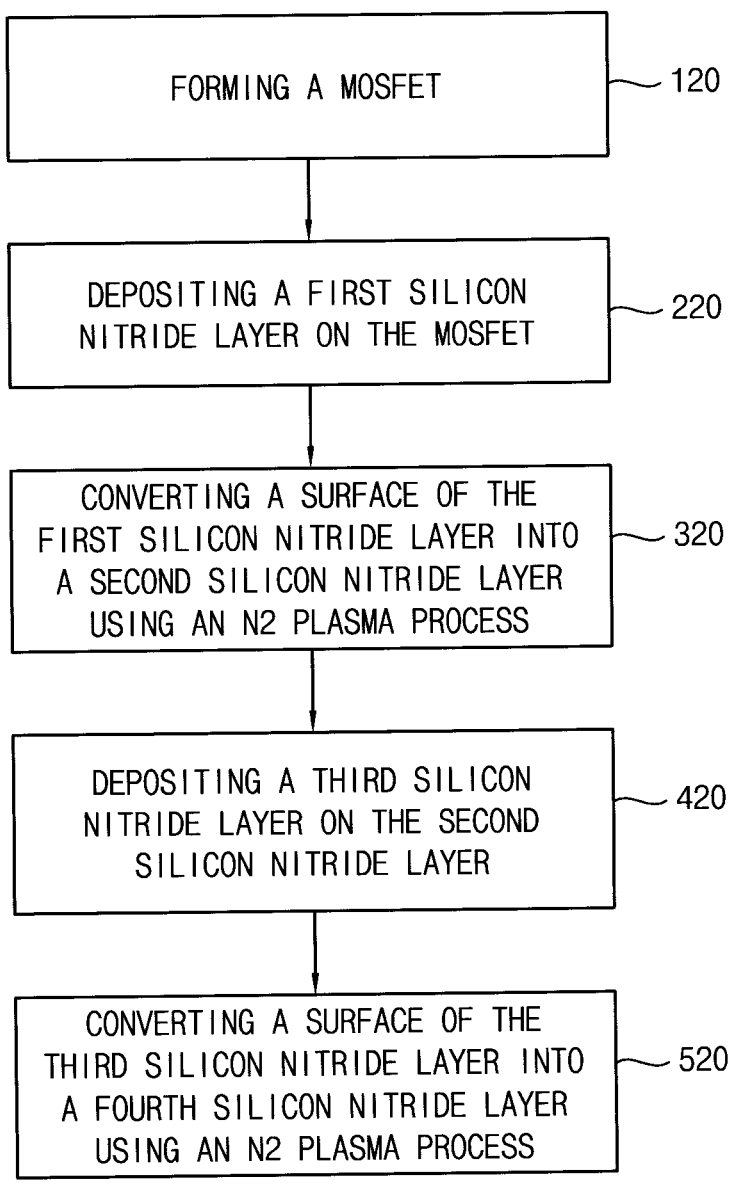
Figure 18:
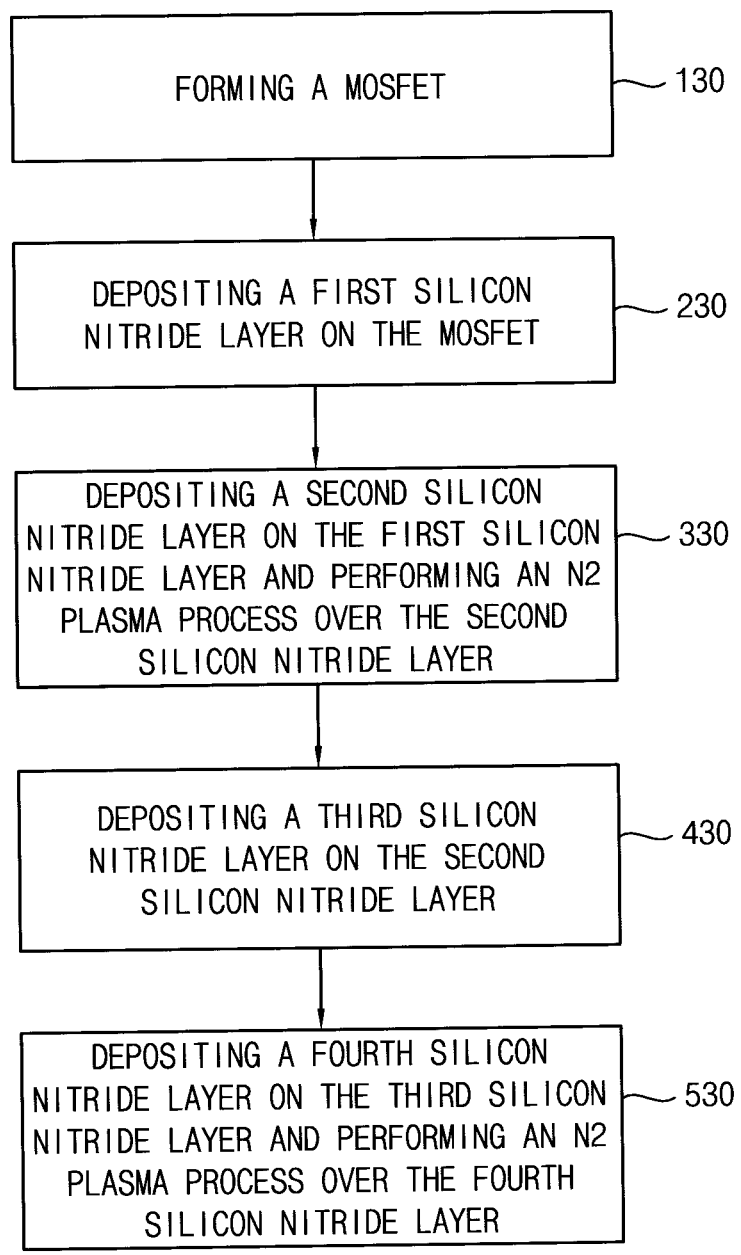
Figure 19:
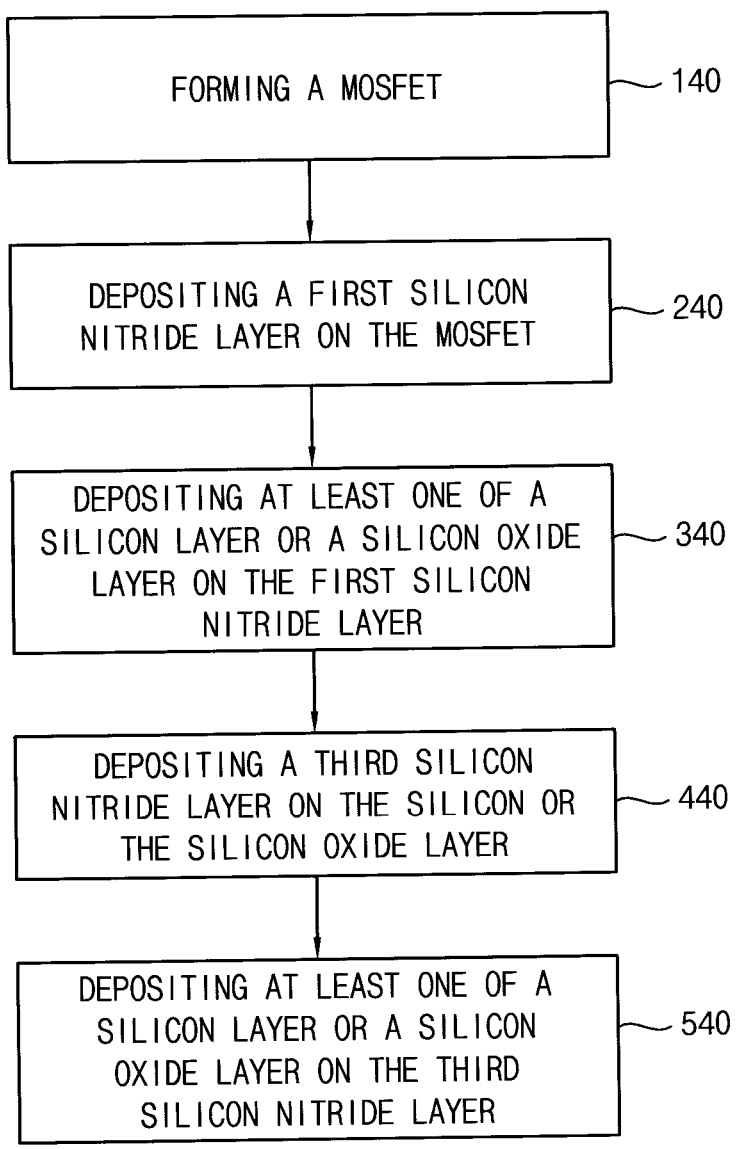

Referring to FIGS. 1, 8 and 15, a MOSFET is formed on a semiconductor substrate in step 100. A first stress layer having a first stress is formed on the MOSFET in step 200. A second stress layer having a second stress is formed on the first stress layer in step 300. The first stress is different from the second stress. A third stress layer is formed on the second stress layer in step 400. A fourth stress layer is formed on the third stress layer in step 500. The third stress layer has a third stress which is substantially the same as the first stress and the fourth stress layer has a fourth stress which is substantially the same as the second stress.

In an exemplary embodiment, tensile stresses of respective stress layers can be controlled using different pressures when depositing layers. For example, referring to FIGS. 4, 5, 16 and 21, a MOSFET is formed on a semiconductor substrate in step 110. A first silicon nitride layer is deposited on the MOSFET under a first pressure in step 210. A second silicon nitride is deposited on the first silicon nitride layer under a second pressure in step 310. The first pressure is higher than the second pressure. The first pressure is about 5 Torr to about 10 Torr, and the second pressure is about 2 Torr to about 4 Torr. A third silicon nitride layer is deposited on the second silicon nitride layer under the first pressure in step 410. A fourth silicon nitride layer is deposited on the third silicon nitride layer under the second pressure in step 510.

In an exemplary embodiment, a tensile stress of a layer can be controlled using an $N_2$ plasma process. For example, referring to FIGS. 6, 7 and 17, a MOSFET is formed on a substrate in step 120. A first silicon nitride layer is formed on the MOSFET in step 220. A surface of the first silicon nitride layer is converted into a second silicon nitride layer using the $N_2$ plasma process in step 320. A third silicon nitride layer is deposited on the second silicon nitride layer in step 420. A surface of the third silicon nitride layer is converted into a fourth silicon nitride layer using the $N_2$ plasma process 520.

In an exemplary embodiment, a tensile stress of a layer can be controlled using an $N_2$ plasma process. For example, referring to FIGS. 1 and 18, a MOSFET is formed on a semiconductor substrate in step 130. A first silicon nitride layer is deposited on the MOSFET in step 230. A second silicon nitride layer is deposited on the first silicon nitride layer and an $N_2$ plasma process is performed over the second silicon nitride layer in step 330. A third silicon nitride layer is deposited on the second silicon nitride layer in step 430. A fourth silicon nitride layer is deposited on the third silicon nitride layer and an $N_2$ plasma process is performed over the fourth silicon nitride layer in step 530.

In an exemplary embodiment, tensile stresses of respective stress layers can be controlled using different materials for the respective stress layers. For example, referring to FIGS. 8 and 19, a MOSFET is formed on a substrate in step 140. A first silicon nitride layer is deposited on the MOSFET in step 240. At least one of a silicon layer, a silicon oxide layer, or a silicon oxynitride layer is deposited on the first silicon nitride layer in step 340. A third silicon nitride layer is deposited on the silicon or the silicon oxide layer in step 440. At least one of a silicon layer or a silicon oxide layer is deposited on the third silicon nitride layer in step 540.

Figure 20:
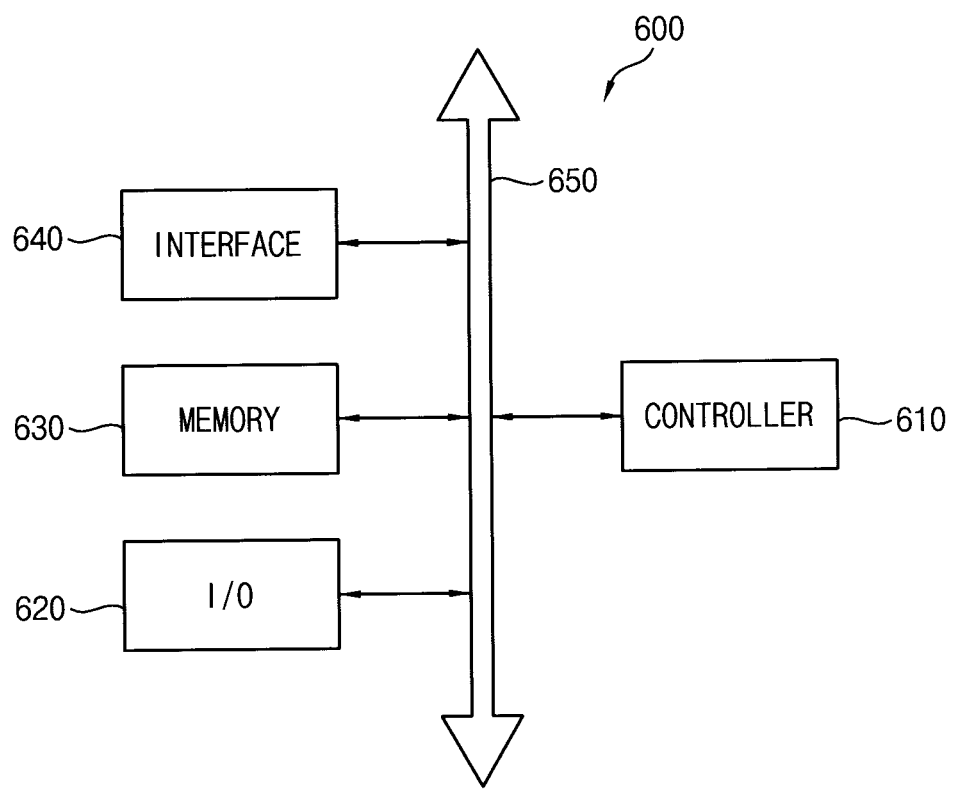
FIG. 20 shows a system comprising a memory device formed according to an exemplary embodiment of the present invention.

FIG. 20 shows a system comprising a memory device according to an exemplary embodiment of the present invention. The memory of the system may include a plurality of stress layers according to an exemplary embodiment of the present invention. Referring to FIG. 20, a system 600 comprises a controller 610, an input/output device 620, a memory 630, an interface 640, and a bus 650. The system 600 may include a mobile system such as a personal data assistance (PDA), a portable computer, a web tablet, a wireless phone, a mobile phone, a digital music player, or a memory card. In an exemplary embodiment, the system 600 can be any system transmitting and/or receiving information. The controller 610 may include, for example, a microprocessor, a digital signal processor, or a microcontroller. The I/O device 620 may include a keypad, keyboard or display. The memory 630 can include, for example, a DRAM or a flash memory. The memory 630 can store commands executed by the controller 610. The memory 630 and the interface 640 can be combined by the bus 650. The system 600 can use the interface 640 to transmit data into a communication network or to receive data from the communication network.

FIG. 21 shows a tensile stress of a silicon nitride layer with respect to a pressure applied to the silicon nitride layer according to an exemplary embodiment of the present invention. For example, when a pressure applied to the silicon nitride layer during a formation of the silicon nitride layer is about 5 Torr to about 10 Torr, a tensile stress of the silicon nitride layer can be about 1.5 Gpa to about 1.7 Gpa. When a pressure applied to the silicon nitride layer during a formation of the silicon nitride layer is about 2 Torr to about 4 Torr, a tensile stress of the silicon nitride layer can be about 1.2 Gpa to about 1.4 Gpa.

Figure 22:
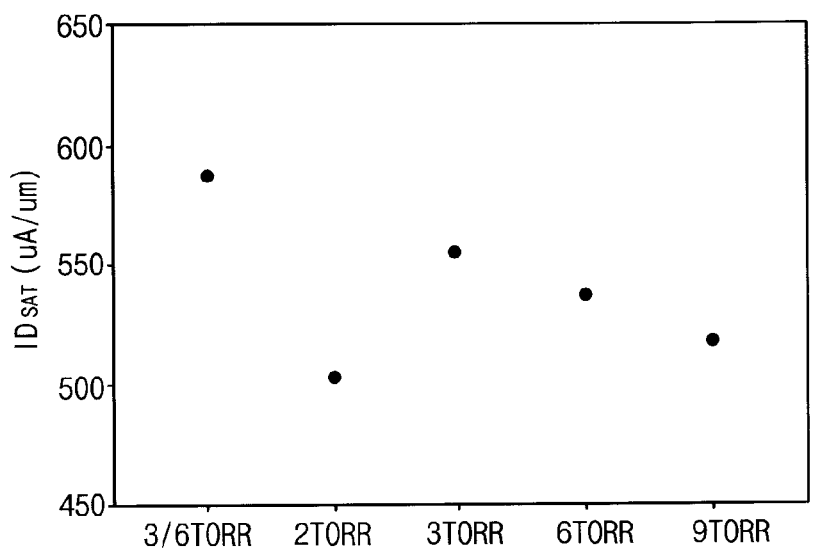
FIG. 22 shows mobilities of current carriers moving across the channel region in an exemplary embodiment as compared to other examples.

FIG. 22 shows mobilities of current carriers moving across the channel region in an exemplary embodiment as compared to other examples. For example, when two pairs of 3 Torr/6 Torr pressurized layers are stacked on top of each other, the mobility of current carriers can be about 580 IDsat (uA/um). However, when a single or multiple layers receiving a single pressure, thereby each layer has a same tensile stress, are stacked on top of each other, the mobility of current carriers can be less than about 550 IDsat (uA/um).

Figure 23:
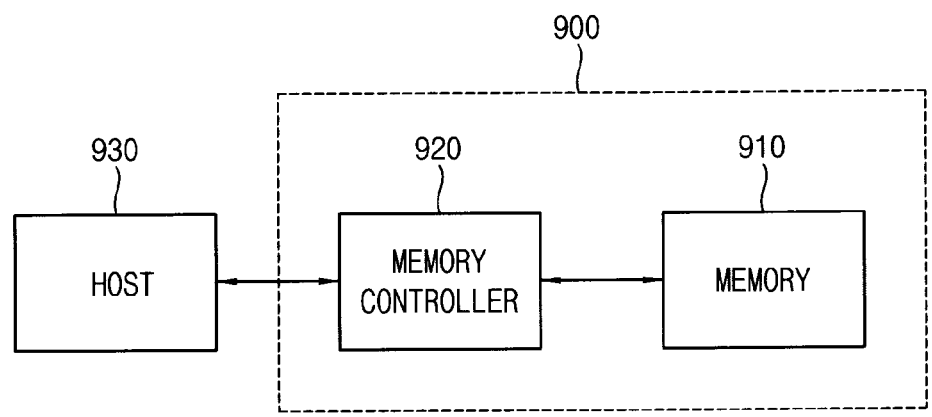
FIG. 23 shows a memory system including a semiconductor device according to at least one embodiment of the present invention.

Referring to FIG. 23, a memory system including a semiconductor device according to at least one embodiment of the present invention will be described. A memory system 900 includes a memory controller 920 and a memory 910 having a varying data storage capacitor structure according to at least one embodiment of the present invention. The memory controller 920 controls the memory device 910 to read or write data from/into the memory 910 in response to a read/write request of a host 930. The memory controller 920 may include an address mapping table for mapping an address provided from the host 930 (e.g., mobile devices or computer systems) into a physical address of the memory device 910.

Figure 24:
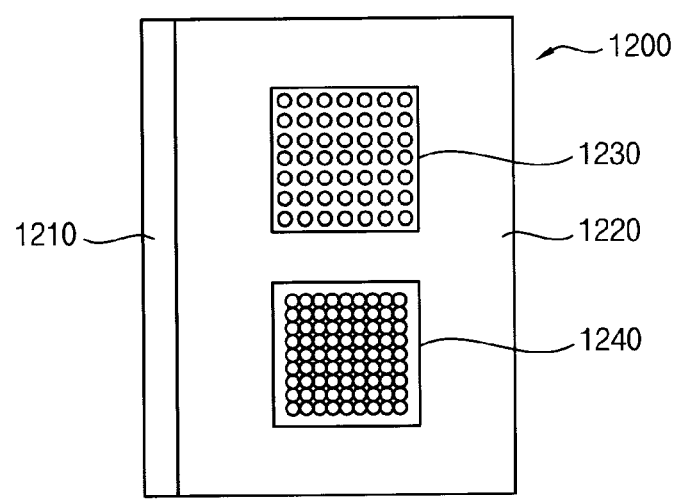
FIG. 24 shows a modular memory device including a semiconductor device according to exemplary embodiments.

Referring to FIG. 24, a modular memory device including a semiconductor device according to exemplary embodiments will be described. The modular memory device 1200 may include a printed circuit board 1220. The printed circuit board 1220 may form one of the external surfaces of the modular memory device 1200. The printed circuit board 1220 may support a memory unit 1230, a device interface unit 1240, and an electrical connector 1210.

The memory unit 1230 having a varying data storage capacitor structure according to at least one embodiment of the present invention may include a three-dimensional memory array and may be connected to a memory array controller. The memory array may include the appropriate number of memory cells arranged in a three-dimensional lattice on the printed circuit board 1220. The device interface unit 1240 may be formed on a separated substrate such that the device interface unit 1240 may be electrically connected to the memory unit 1230 and the electrical connector 1210 through the printed circuit board 1220. Additionally, the memory unit 1230 and the device interface unit 1240 may be directly mounted on the printed circuit board 1220. The device interface unit 1240 may include components necessary for generating voltages, clock frequencies, and protocol logic.

According to exemplary embodiments, a plurality of etch stop layers (or, stress layers) disposed on a MOSFET. A low tensile stress layer prevents a high tensile stress layer from being retracted. As such, stress relaxation of the high tensile stress layer can be prevented. Accordingly, a stronger tensile stress can be applied to a channel region of the MOSFET. Therefore, the carrier mobility in the channel region can be improved.

Although the exemplary embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A semiconductor device, comprising:
   a metal-oxide-silicon field-effect transistor (MOSFET); and
   a plurality of stress layers disposed on the MOSFET,
   wherein the plurality of stress layers include a first stress layer disposed on the MOSFET, and a second stress layer disposed on the first stress layer, the first stress layer having a first stress and the second stress layer having a second stress,
   wherein the plurality of stress layers further include a third stress layer disposed on the second stress layer and a fourth stress layer disposed on the third stress layer, the third stress layer having a third stress and the fourth stress layer having a fourth stress, and
   wherein the first stress is higher than each of the second and fourth stresses, and the third stress is higher than each of the second and fourth stresses.

2. The semiconductor device of claim 1, wherein the first stress is about 1.5 Gpa to about 1.7 Gpa tensile stress, and the second stress is about 1.2 Gpa to about 1.4 Gpa tensile stress.

3. The semiconductor device of claim 2, wherein the first stress layer and the second stress layer comprise a same material.

4. The semiconductor device of claim 3, wherein the same material comprises silicon nitride.

5. The semiconductor device of claim 2, wherein the first stress layer and the second stress layer comprise a different material.

6. The semiconductor device of claim 5, wherein the first stress layer comprises silicon nitride and the second stress layer comprises at least one of silicon or silicon oxide.

7. The semiconductor device of claim 6, wherein the first stress layer and the second stress layer have a substantially same thickness.

8. The semiconductor device of claim 1, wherein the third stress is substantially the same as the first stress and the fourth stress is substantially the same as the second stress.

9. The semiconductor device of claim 1, wherein each of the first and third stresses is about 1.5 Gpa to about 1.7 Gpa tensile stress, and each of the second and fourth stresses is about 1.2 Gpa to about 1.4 Gpa tensile stress.

10. The semiconductor device of claim 9, wherein the first, second, third and fourth stress layers comprise silicon nitride.

11. The semiconductor device of claim 9, wherein each of the first and third stress layers comprises silicon nitride and each of the second and fourth stress layers comprises at least one of silicon or silicon oxide.

12. The semiconductor device of claim 1, wherein the MOSFET comprises a MOS capacitor and impurity regions.

13. A method of forming a semiconductor device, the method comprising:
   forming a MOSFET;
   forming a first stress layer having a first stress on the MOSFET;
   forming a second stress layer having a second stress on the first stress layer,
   forming a third stress layer having a third stress on the second stress layer, and
   forming a fourth stress layer having a fourth stress on the third stress layer,
   wherein the first stress is higher than each of the second and fourth stresses, and the third stress is higher than each of the second and fourth stresses.

14. The method of claim 13, wherein forming the first stress layer comprises depositing a first silicon nitride layer under a first pressure, and forming the second stress layer comprises depositing a second silicon nitride layer under a second pressure, wherein the first pressure is higher than the second pressure.

15. The method of claim 14, wherein the first pressure is about 5 Torr to about 10 Torr, and the second pressure is about 2 Torr to about 4 Torr.

16. The method of claim 13, wherein forming the first stress layer comprises depositing a first silicon nitride layer, and forming the second stress layer comprises converting a surface of the first silicon nitride layer into a second silicon nitride layer using an $N_2$ plasma process.

17. The method of claim 13, wherein forming the first stress layer comprises depositing a first silicon nitride layer, and forming the second stress layer comprises depositing a second silicon nitride layer and performing an $N_2$ plasma process over the second silicon nitride layer.

18. The method of claim 13, wherein forming the first stress layer comprises depositing a silicon nitride layer, and forming the second stress layer comprises depositing at least one of a silicon layer or a silicon oxide layer.

19. The method of claim 13, wherein the third stress layer has a third stress which is substantially the same as the first stress and the fourth stress layer has a fourth stress which is substantially the same as the second stress.

20. A semiconductor device, comprising: a MOSFET; and a plurality of stress layers disposed on the MOSFET, wherein the plurality of stress layers include a pair of stress layers having a first stress layer and a second stress layer disposed on the first stress layer, the first stress layer having a first stress and the second stress layer having a second stress which is lower than the first stress, and the pair of stress layers are repeatedly stacked on top of each other.

21. The semiconductor device of claim 20, wherein the first stress is about 1.5 Gpa to about 1.7 Gpa tensile stress, and the second stress is about 1.2 Gpa to about 1.4 Gpa tensile stress.

22. A system for transmitting or receiving data, the system comprising:
   a memory device for storing a program;
   a processor in communication with the memory device, wherein the memory device comprises:
   a MOSFET; and
   a plurality of stress layers disposed on the MOSFET, wherein the plurality of stress layers include a pair of stress layers having a first stress layer and a second stress layer disposed on the first stress layer, the first stress layer having a first stress and the second stress layer having a second stress which is lower than the first stress, and the pair of stress layers are repeatedly stacked on top of each other.

23. The system of claim 22, wherein the system comprises at least one of a mobile system, a portable computer, a web tablet, a mobile phone, a digital music player, or a memory card.

* * * * *